July 20, 1965 D. N. SEWELL 3,195,182

ELECTRICAL DELAY LINE FORMING APPARATUS

Filed June 13, 1962 2 Sheets-Sheet 1

ELECTRICAL DELAY LINE FORMING APPARATUS

Filed June 13, 1962 2 Sheets-Sheet 2

United States Patent Office 3,195,182

Patented July 20, 1965

3,195,182

ELECTRICAL DELAY LINE FORMING APPARATUS

Donald N. Sewell, Raymond, Maine, assignor to Dielectric Products Engineering Company, Inc., Raymond, Maine, a corporation of Michigan Filed June 13, 1962, Ser. No. 202,204
2 Claims. (Cl. 18—8)

This invention relates to apparatus for forming electrical delay line configurations for operation at microwave frequencies and more particularly to methods and apparatus particularly adapted for forming coaxial electrical transmission cable into uniform coils suitable for use in delay line structures of accurate electrical length.

Coaxial cable may be used in microwave applications for providing precise time delay in electrical signal transmission. Such cable, however, must be carefully handled and not distorted so that the requisite precision signal transmission characteristics are obtained in a reliable and reproducible manner. In certain electrical delay unit applications space is an important consideration and the length of delay line component must be formed to occupy as small a space as possible, taking into consideration the physical characteristics which limit the forming operations to which the component can be subjected without distortion or mechanical impairment.

Accordingly, an object of this invention is to provide novel and improved apparatus for forming compact electrical delay line structures.

Another object of this invention is to provide novel and improved coiling apparatus for forming multilayer coils of electrical signal transmission line in which both ends of the line are on the outside of the coils so that connections to and adjustments of the line are facilitated.

Another object of the invention is to provide novel and improved apparatus suitable for forming flexible material in accurately dimensioned, uniform, multilayer coils.

A further object of the invention is to provide a novel and improved coiling apparatus particularly suitable for forming coaxial cable into multilayer coils without impairing its electrical characteristics to form a compact electrical delay line structure of highly accurate electrical length operable at microwave frequencies.

In accordance with the invention there is provided an apparatus on which a compact electrical delay line structure in the form of a multilayer coil having bends of uniform minimum radius is formed, with both ends of the coil material on the outside of the coil. The apparatus employs a plurality of rigid frustoconical flights arranged in alternate descending and ascending relation, the number of flights corresponding to the number of layers in the coil. The several frustoconical flights are arranged to be assembled together in axial relation and driven in rotation as a unit. Each flight is formed with a smooth circumferential surface that extends along a helical path adjacent a correspondingly smooth axially extending surface to form a seat to receive the electrical transmission in a component to be formed thereon. In the disclosed embodiment a continuous strip of metal formed in a flat coil and then distorted to the frustoconical configuration to define the smooth, continuous helical seat and rigidly secured in this distorted frustoconical configuration. The minimum diameter of each frustoconical surface corresponds to the minimum permissible bending radius of the transmission line in a component being coiled.

In operation, the several flights are assembled axially in driving relation. An end of the transmission line component to be formed is placed at a point on one end flight as a function of the electrical delay value of the formation that is desired. The assembled flights are then rotated as a unit and the component conformed to the helical flight surface first with decreasing radius to the point of minimum radius and then across a smooth transition between the flights and continuing on a flight surface of increasing radius of the adjacent flight to the initial starting diameter. At that point a transition may be made over the second flight to the corresponding position on the adjacent third flight for continued forming of decreasing radius. After the predetermined number of layers have been formed on an even number of flights, the forming apparatus is stopped and the two end flights are moved away from one another to permit removal of any intermediate flights and the formed delay line component from the apparatus. The formed component then is secured in multilayer configuration with both ends thereof on the outside and easily accessible. The invention thus permits the forming of a compact and accurate electrical delay line component. The apparatus has versatility to accommodate a variety of delay line lengths of electrical transmission and in differing numbers of layers and has particular advantage in accurately and neatly forming coaxial cable without sharp bends which might damage or impair the electrical and mechanical characteristics of the cable.

Other objects, features and advantages of the invention will be seen as the following description of a preferred embodiment thereof progresses in conjunction with the drawings, in which.

Figures 1, 2, 3:
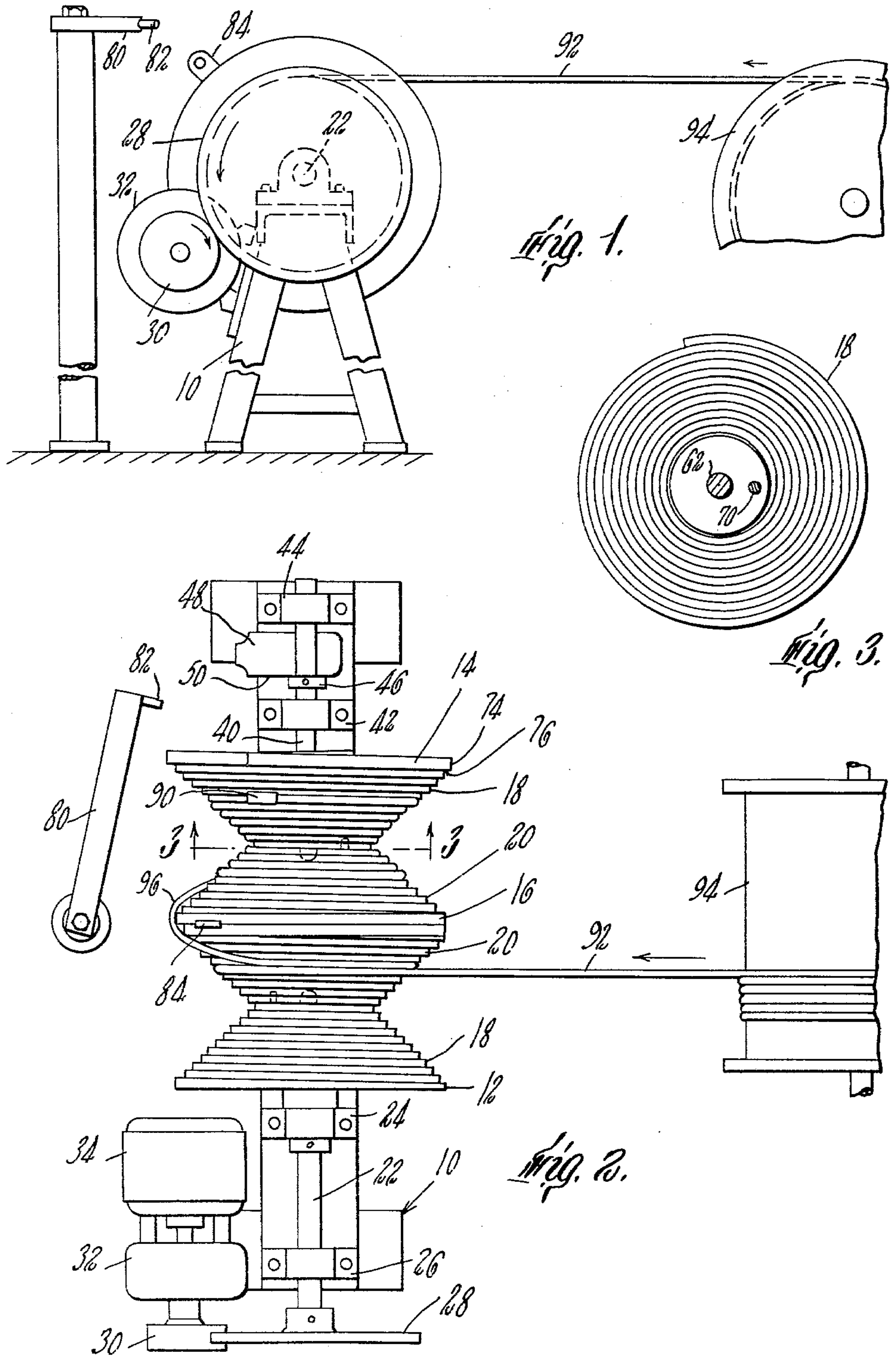
FIG. 1 is an end elevational view of electrical delay line forming apparatus constructed in accordance with a preferred embodiment of the invention.
FIG. 2 is a top view of the forming apparatus shown in FIG. 1.
FIG. 3 is a sectional view of the forming apparatus taken along the line 3—3 of FIG. 2 showing details of one of the transmission line components forming flights.

With reference to FIGS. 1 and 2 the forming apparatus is mounted on support structure 10 and includes two end flight members 12, 14 and an intermediate flight member 16. Each end member has a helical surface 18, and the intermediate flight has two similar helical surfaces 20 each having a termination of minimum radius adapted to mate with a termination of corresponding radius of an adjacent end member 12, 14.

End flight member 12 has a shaft 22 supported by bearing blocks 24, 26 mounted on a frame that is secured to a portion of support structure 10. An illustrative power transmission train includes a disc 28, mounted on shaft 22, which is frictionally engaged by a drum 30 that is coupled through gear reducer 32 to electric drive motor 34. The other end flight 14 is mounted on shaft 40 that is supported on bearing blocks 42, 44. A collar 46 secured to shaft 40 intermediate the bearing block controls the axial position of the shaft. Collar 46 cooperates with spring bracket 48 which has an edge portion 50 that engages the radial edge of the collar when the flight members 12, 14, 16 are assembled together as shown in FIGS. 1, 2 and 4 to maintain the several flights in axially assembled relation.

Each flight is of generally frusto-conical configuration, the end flights tapering to a minimum radius remote from the support shaft and the intermediate flight having its maximum radius at its contact. Each flight surface has a three-dimensional forming surface 18, 20 which extends along a helical path and terminates in a flat radially extending surface 60 that mates with a corresponding radially extending surface of the adjacent member. The nose 62 of each shaft 22, 40 protrudes through the radial surface of the end flight and is received in a cylindrical bore 64 in the intermediate member radial surface when the members are disposed in assembled relation. An aligning pin 66 carried by flight member 12 and extending parallel to but radially offset from the nose portion 62 of shaft 22, enters an aligning hole 68 in one radial terminal plate of the intermediate member 16. The other terminal plate of flight member 16 carries a similar pin 70 which cooperates with hole 62 in the radial terminal surface of end member 14. These pins 66, 70 assure proper positioning of helical forming surfaces of the intermediate member relative to the forming surfaces of the two end flight members and also function to couple driving forces to the assembled members 14, 16 from the driven flight member 12. Each helical forming surface combines an axially extending portion 74 in the form of a helix and a radially extending portion 76 of increasing diameter. These combined surface portions are formed in the illustrated embodiment by distorting a flat coil of metallic strip material to form a series of steps of equal height and then securing the step configuration in position by welding. End member 12 is formed from a flat coil wound in the counterclockwise direction as viewed in FIG. 1 and end member 14 is formed from a flat coil wound in the clockwise direction. The intermediate member 16 is similarly formed from two coils wound in opposite directions distorted to form the fourth conical configuration, secured, wound in opposite directions, and positioned in back to back relation.

Figure 4:
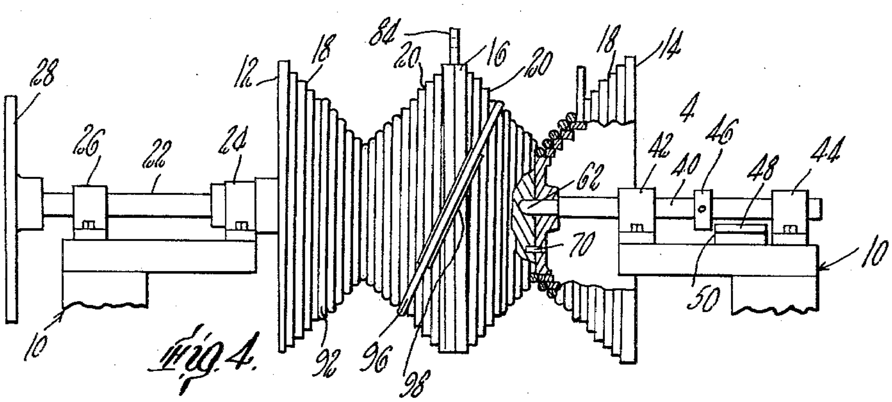
FIG. 4 is a side view showing the components of the forming apparatus being employed in a delay line unit forming operation.
Figure 5:
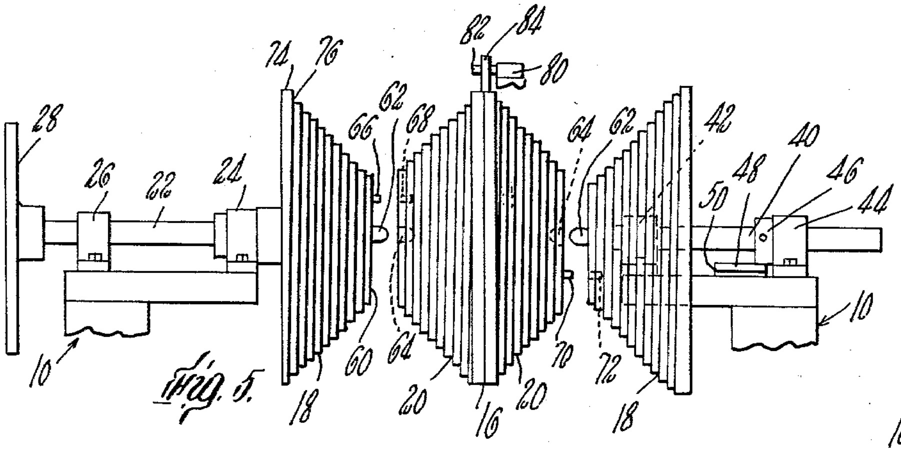
FIG. 5 is a side view similar to FIG. 4 showing the forming flights separated.

When it is desired to form a delay line unit the intermediate member 16 is positioned between the end members 12, 14 as shown in FIG. 5, supported by pivotable arm 80 which carries a pin 82 that passes through eye 84 on flight 16. End member 14 is then moved toward end member 12 so that the shaft noses 60 engage the holes in the intermediate member and the axial aligning and driving studs 66, 70 enter the cooperating recesses so that the three members are secured for rotation as a unit as shown in FIG. 4. In this position collar 46 is restrained against axial motion by the edge 50 of spring bracket 48.

Figures 6, 8, 9:
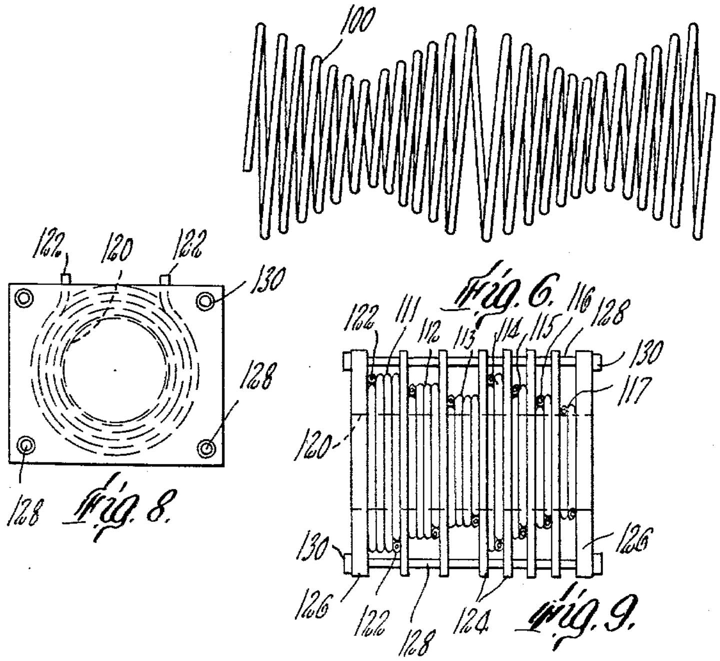
FIG. 6 is a view of a delay line unit formed on the apparatus of FIGS. 1–5 with the adjacent turns separated.
FIGS. 8 and 9 are end and top views of an assembly of coaxial cable delay lines of varying length, all of which may be formed on apparatus constructed in accordance with principles of the invention.
Figure 7:
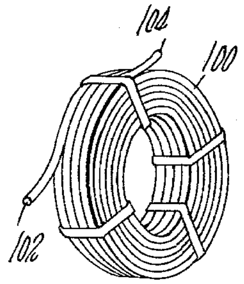
FIG. 7 is a perspective view of a compacted delay line unit formed by the apparatus of the invention.

In forming a delay line unit the end 90 of a coaxial electrical cable 92 such as that sold under the trade names Styroflex and Foamflex, for example, is taped or otherwise secured on the helical forming surface of member 12 at a radius as a function of the desired electrical length of the unit, as indicated in FIG. 4. Motor 34 is then started and the assembly of flights is rotated with the coaxial cable being fed smoothly from storage drum 94 under uniform tension and conformed to the helical seating surface of the descending flight of member 12. When the bottom of that flight is reached the cable is formed over the smooth transition portion between members 12 and 16 and coiling continues without interruption up the ascending flight of the intermediate member 16 to a point corresponding to the point at which coiling was started on end member 12. A transition 96 of the cable 92 is then made over the point of greatest diameter of the intermediate flight, in which area it may be desirable to protect the cable by use of a flat flexible member 98 positioned between the cable transition 96 and that portion of member 16. Forming continues on the descending flight of the intermediate member and the ascending flight of end member 14 with the cable being continuously conformed to the helical seating surface in a smooth and uniform operation until the same diameter as the start is reached on member 14. At that point the formed cable is severed from the supply, the intermediate flight member 16 is secured on the support 80, and the spring bracket 48 depressed so that the flights may be separated. The coiled cable having a configuration as indicated in FIG. 6 then is removed with the intermediate member 16 being withdrawn through the spaced turns thereof. The formed delay line unit is then secured, as by taping, in a compact smooth coil 100 of uniform diameter with both terminals 102, 104 of the unit in accessible location as shown in FIG. 7. This structure enables the precise forming of coaxial cable in a compact, uniform electrical delay line unit in an expeditious manner without distorting or otherwise impairing the electrical qualities of the cable.

This form of delay line unit is particularly advantageous for use in an assembly of several precision delay line units 111–117 disposed in closely stacked relation as diagrammatically indicated in FIGS. 8 and 9. These delay lines are uniformly coiled for mounting on a central support tube 120 of predetermined radius. The lengths of the transmission lines in the units are graduated as generally indicated in these figures. In order to facilitate connection to and/or adjustment of the delay lines in this compact assembly all the line terminations 102, 104 are brought out to terminals 122 at the top of the unit. Spacers 124 are mounted on the tube 120 between adjacent delay line units and end walls 126 to provide support for the control tube 120 and the several units. Clamping rods 128 extend through the end walls 126 and the spacers 124 and are secured with nuts 130 to clamp the several delay line units securely. In this manner a compact, accurate, rugged multiple delay line assembly having accessible terminals may be formed in an expeditious manner. The apparatus of the invention may be used to form the several different configurations of units employed in this assembly.

While a preferred embodiment of the invention has been shown and described modifications thereof will be obvious to those skilled in the art and therefore it is not intended that the invention be limited thereto or to details thereof and departures may be made therefrom within the spirit and scope of the invention as defined in the claims.

I claim:

1. Apparatus for forming a multilayer compact cylindrical electrical signal delay unit having flat end surfaces with terminal means at each end surface at the point of greatest radius of said cylindrical unit, comprising two end members, each having a frustoconical surface on which a helical seat defined by a continuous axially extending surface and continuous radially extending surface contiguous with said axially extending surface is formed for receiving a transmission line component of indeterminate length to be coiled along the length of said seat, an intermediate member having two frustoconical surfaces on which a continuous helical seat is formed to provide a continuous axially extending support surface having a first portion of increasing radius and a second portion of decreasing radius, said intermediate member being removably positioned between said end members so that said seats define a continuous series of alternating descending and ascending paths, said end members supported for rotation about a common axis, the helical seat on each said end member descending as it approaches the other end member, means to drive one of said end members in rotation, means for securing said intermediate member and said end members in axial alignment for rotation as a unit so that said transmission line component may be formed on said members in a coil having an even number of multiturn layers with the ends of said transmission line component on the outside of the end layers, and means to separate said intermediate and end members at their points of minimum diameter to remove the formed transmission line component therefrom.

2. The apparatus as claimed in claim 1 wherein said drive means includes a cylindrical member mounted coaxially with said end members and having a smooth peripheral surface, and a driving member in light frictional engagement with said peripheral surface so that slipping between said driving member and said peripheral surface occurs upon moderate load being imposed on said end members.

References Cited by the Examiner

UNITED STATES PATENTS

| | | | |
|---|---|---|---|
| 1,161,988 | 11/15 | Simonsen | 153—64 |
| 1,165,779 | 12/15 | Humphrey | 153—67 |
| 1,483,985 | 2/24 | Price | 153—64 |
| 2,349,828 | 5/44 | Moray | 153—64 |
| 2,983,300 | 5/61 | Abbott | 153—2 |

CHARLES W. LANHAM, *Primary Examiner.*